(12) United States Patent
Kim et al.

(10) Patent No.: US 8,450,916 B2
(45) Date of Patent: May 28, 2013

(54) DISPLAY DEVICE AND METHOD FOR MANUFACTURING DISPLAY DEVICE

(75) Inventors: Joon-Hyung Kim, Yongin (KR);
Jin-Han Park, Yongin (KR); Cheol-Lae Roh, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 12/926,519

(22) Filed: Nov. 23, 2010

(65) Prior Publication Data

US 2011/0121714 A1    May 26, 2011

(30) Foreign Application Priority Data

Nov. 24, 2009   (KR) .................. 10-2009-0114167

(51) Int. Cl.
*H01J 5/00*    (2006.01)

(52) U.S. Cl.
USPC .............................. 313/317; 445/25; 312/512

(58) Field of Classification Search
USPC ............... 257/40, 72, 98–100, 642–643, 759; 313/498–512; 315/169.1, 169.3, 169.2; 427/58, 427/64, 66, 532–535, 539; 428/690–691, 428/917; 438/26–29, 34, 82, 455; 445/24–25
See application file for complete search history.

(56) References Cited

U.S. PATENT DOCUMENTS

| | | | | |
|---|---|---|---|---|
| 5,368,942 A | * | 11/1994 | Smith et al. ................... | 428/420 |
| 5,742,129 A | * | 4/1998 | Nagayama et al. ............ | 315/167 |
| 2006/0028133 A1 | * | 2/2006 | Kondo et al. .................. | 313/512 |
| 2006/0119953 A1 | * | 6/2006 | Morrissey et al. ............ | 359/640 |
| 2006/0199353 A1 | * | 9/2006 | Kub et al. ...................... | 438/455 |
| 2009/0137095 A1 | * | 5/2009 | Shimomura et al. .......... | 438/455 |
| 2010/0084634 A1 | * | 4/2010 | Gamo et al. ................... | 257/40 |
| 2011/0039094 A1 | * | 2/2011 | Sivasankar et al. ........... | 428/332 |

FOREIGN PATENT DOCUMENTS

| | | |
|---|---|---|
| JP | 05-055100 A | 3/1993 |
| JP | 2000-357587 A | 12/2000 |
| JP | 2006-236880 A | 9/2006 |
| KR | 10-0177872 B1 | 11/1998 |
| KR | 10 2007-0088671 A | 8/2007 |
| KR | 10-0748723 B1 | 8/2007 |

* cited by examiner

*Primary Examiner* — Donald Raleigh
(74) *Attorney, Agent, or Firm* — Lee & Morse, P.C.

(57) ABSTRACT

A display device including a first substrate; a display unit on the first substrate, the display unit displaying an image; and a second substrate facing the first substrate with the display unit interposed therebetween, wherein the first substrate and the second substrate are optical contact bonded to each other.

18 Claims, 10 Drawing Sheets

DISPLAY DEVICE AND METHOD FOR MANUFACTURING DISPLAY DEVICE

BACKGROUND

1. Field

Embodiments relate to a display device and a method for manufacturing the display device.

2. Description of the Related Art

A display device is a device that displays an image. Recently, organic light emitting diode display devices have been drawing attention.

An organic light emitting diode display has a self-luminous characteristic, i.e., the organic light emitting diode display does not need a separate light source. Accordingly, unlike a liquid crystal display, it may have a relatively small thickness and weight. In addition, the organic light emitting diode display may exhibit high-quality characteristics, e.g., low power consumption, high luminance, high response speed, etc.

A conventional organic light emitting diode display may include a display substrate having an organic light emitting diode thereon, an encapsulation substrate facing the display substrate and protecting the organic light emitting diode, and a sealant, e.g., an epoxy or frit, for bonding and sealing the display substrate and the encapsulation substrate together.

In order to bond and seal the display substrate and the encapsulation substrate together, the sealant may be interposed between the display substrate and the encapsulation substrate. Then, the sealant may be hardened to bond and seal the display substrate and the encapsulation substrate together.

The above information disclosed in this Background section is only for enhancement of understanding of the background of the described technology and therefore it may contain information that does not form the prior art that is already known in this country to a person of ordinary skill in the art.

SUMMARY

Embodiments are directed to a display device and a method for manufacturing the display device, which represent advances over the related art.

It is a feature of an embodiment to provide a display device that suppresses deformation of a substrate due to sealant deformation.

It is another feature of an embodiment to provide method of forming a display device that suppresses deformation of a substrate due to sealant deformation by placing two substrates in direct contact with each other.

At least one of the above and other features and advantages may be realized by providing a display device including a first substrate; a display unit on the first substrate, the display unit displaying an image; and a second substrate facing the first substrate with the display unit interposed therebetween, wherein the first substrate and the second substrate are optical contact bonded to each other.

The optical contact bond between the first substrate and the second substrate may be formed by a Van der Waal's force between a first molecule of the first substrate and a second molecule of the second substrate.

Optical contact bonding portions of the first substrate and the second substrate may be made of amorphous glass.

A first portion of the first substrate contacting the second substrate and a second portion of the second substrate contacting the first substrate may be optical surfaces.

The first and second portions may have a surface flatness of about $0.1\lambda$ to about $0.25\lambda$ ($\lambda$ is substantially 632.8 nm).

The first and second portions may have a maximum peak-to-valley roughness of about 100 to about 500 Å or a root-mean-square roughness (RMS value) of about 1 to about 10 Å, and a scratch and dig of about 60-40.

The display unit may include an organic light emitting diode for emitting light.

The first substrate may include a second protrusion protruding in the direction of the second substrate, the second protrusion contacting the second substrate.

The second substrate may include a first protrusion protruding in the direction of the first substrate and contacting the first substrate.

The first substrate may include a second protrusion protruding in the direction of the second substrate and contacting the second substrate.

The second protrusion may contact the first protrusion.

At least one of the above and other features and advantages may also be realized by providing method for manufacturing a display device including preparing a first substrate such that the first substrate has a display unit thereon; preparing a second substrate such that the second substrate faces the first substrate with the display unit interposed therebetween; and optical contact bonding the first substrate and the second substrate together.

Optical contact bonding portions of the first and second substrates may be made of amorphous glass.

The optical contact bonding portions may have a surface flatness of about $0.1\lambda$ to about $0.25\lambda$ ($\lambda$ is substantially 632.8 nm), a maximum peak-to-valley roughness of about 100 to about 500 Å or a root-mean-square roughness (RMS value) of about 1 to about 10 Å, and a scratch and dig of about 60-40.

Washing the first and second portions may include removing inorganic materials from the first and second portions; removing organic materials from the first and second portions with hydrochloric acid (HCl); firstly washing the first and second portions with acetone; and secondly washing the first and second portions with alcohol.

The optical contact bonding of the first substrate and the second substrate may include pressing the first and second substrates together with a pressure of about 0.2 to about 1.2 kg/cm$^2$.

The optical contact bonding the first substrate and the second substrate may include heating the first substrate and the second substrate, and the first and second substrates may be heated to a temperature of about 30 to about 520° C.

The method may further include optically polishing a first portion of the first substrate and a second portion of the second substrate; and washing the first portion of the first substrate and the second portion of the second substrate, wherein the polishing and washing are performed prior to the optical contact bonding.

The optical contact bonding may be performed using a Van der Waal's force acting between a first molecule of the first substrate and a second molecule of the second substrate.

The first and second substrates may be prepared such that at least one of the first and second substrates includes a protrusion protruding in the direction of and contacting the other of the first and second substrates.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2009-0114167, filed on Nov. 24, 2009, in the Korean Intellectual Property Office, and entitled: "Display Device and Method for Manufacturing Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

To clearly describe the exemplary embodiments, parts not related to the description are omitted.

Constituent elements having the same structures throughout the embodiments are denoted by the same reference numerals and are described in a first exemplary embodiment. In the other exemplary embodiments, only the constituent elements other than the same constituent elements are described.

In the drawings, the sizes and thicknesses of the components are merely shown for convenience of explanation, and therefore the embodiments are not limited to the illustrations described and shown herein.

Although the following description will be given with respect to an organic light emitting diode display including an organic emission layer according to an embodiment, the embodiments are not limited thereto, and the display device according to the embodiments may be, e.g., a liquid crystal display, a plasma display panel, a field emission display, and the like.

Hereinafter, a display device 101 according to an embodiment will be described with reference to FIGS. 1 to 4.

Figure 1:
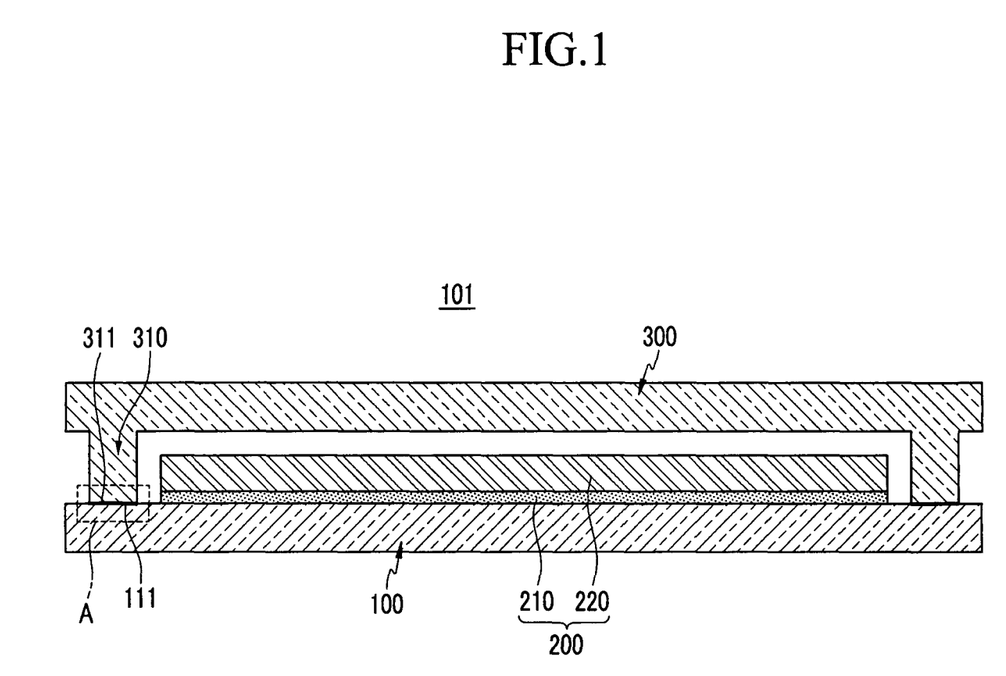
FIG. 1 illustrates a cross-sectional view of a display device according to an embodiment.

FIG. 1 illustrates a cross-sectional view of a display device according to an embodiment.

As illustrated in FIG. 1, the display device 101 according to the present embodiment may include a first substrate 100, a display unit 200, and a second substrate 300.

The first substrate 100 may be made of, e.g., amorphous glass containing silica (silicon dioxide or $SiO_x$), and may have a plate shape with a flat surface. The first substrate 100 may include a first portion 111 contacting a first protrusion 310 of the second substrate 300 to be described below. The first portion 111 of the first substrate 100 may be optically polished.

Here, the optical polishing refers to the polishing of the surface of the first portion 111 of the first substrate 100 so as to form an optical surface.

The first portion 111 of the first substrate 100 may have an optical surface due to the optical polishing. The optical surface of the first portion 111 may have, e.g., a surface flatness of about 0.1λ to about 0.25λ (λ is substantially 632.8 nm), a maximum peak-to-valley roughness of about 100 to about 500 Å or a root-mean-square roughness (RMS value) of about 1 to about 10 Å, and a scratch and dig of about 60-40.

The display unit 200 may be disposed in a display area on the first substrate 100. The display unit 200 may be formed using microelectromechanical systems (MEMS) technology, e.g., photolithography. The display unit 200 may display an image and may include a wiring portion 210 and an organic light emitting diode 220. However, the embodiments are not limited thereto, and in an alternative implementation, the display unit 200 may include, e.g., a liquid crystal display, a plasma display, and/or a discharge needle, depending on the configuration of the display device 101. That is, the display device 101 may be, e.g., a liquid crystal display (LCD), a plasma display panel (PDP), or a field emission display (FED).

The wiring portion 210 may include first and second thin film transistors 10 and 20 (shown in FIG. 2) and may drive the organic light emitting diode 200. The organic light emitting diode 220 may emit light according to a driving signal received from the wiring portion 210.

Hereinafter, an internal structure of the display device 101 will be described in detail with reference to FIGS. 2 and 3.

Figure 2:
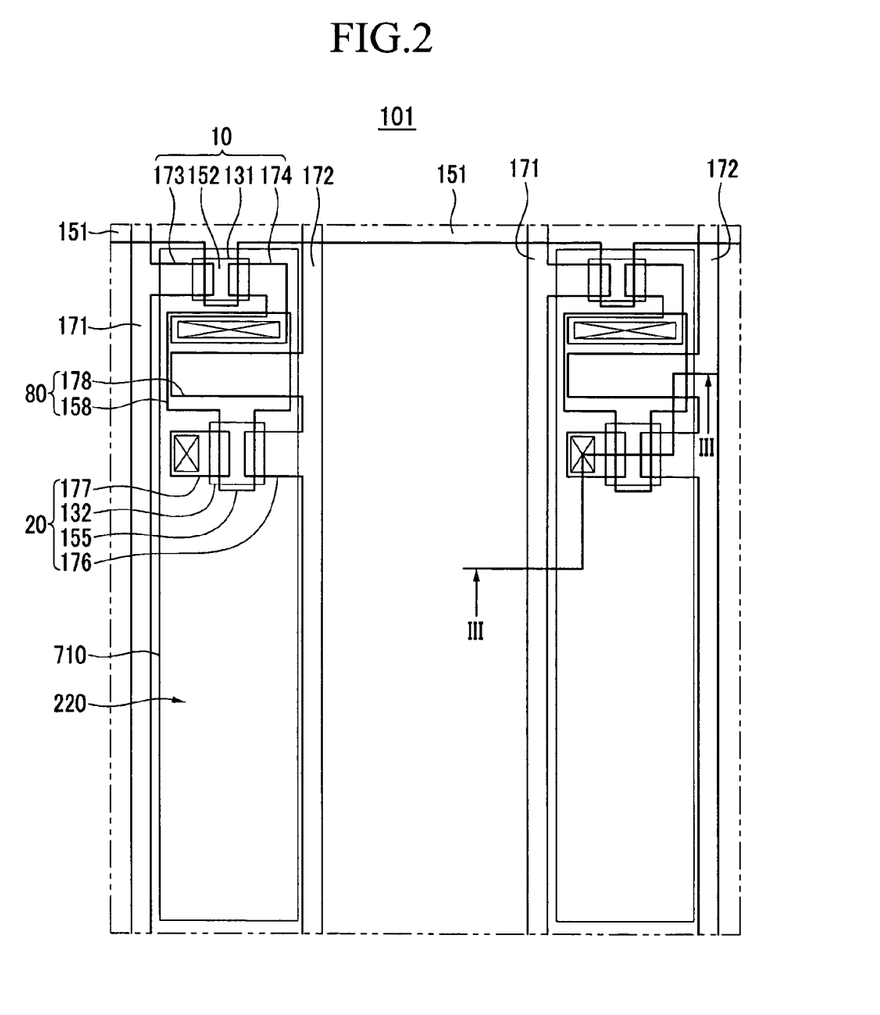
FIG. 2 illustrates a layout view of structure of a pixel of the display device of FIG. 1.

FIG. 2 illustrates a layout view of a structure of a pixel of the display device according to an embodiment. FIG. 3 illustrates a cross-sectional view taken along line III-III of FIG. 2.

Figure 3:
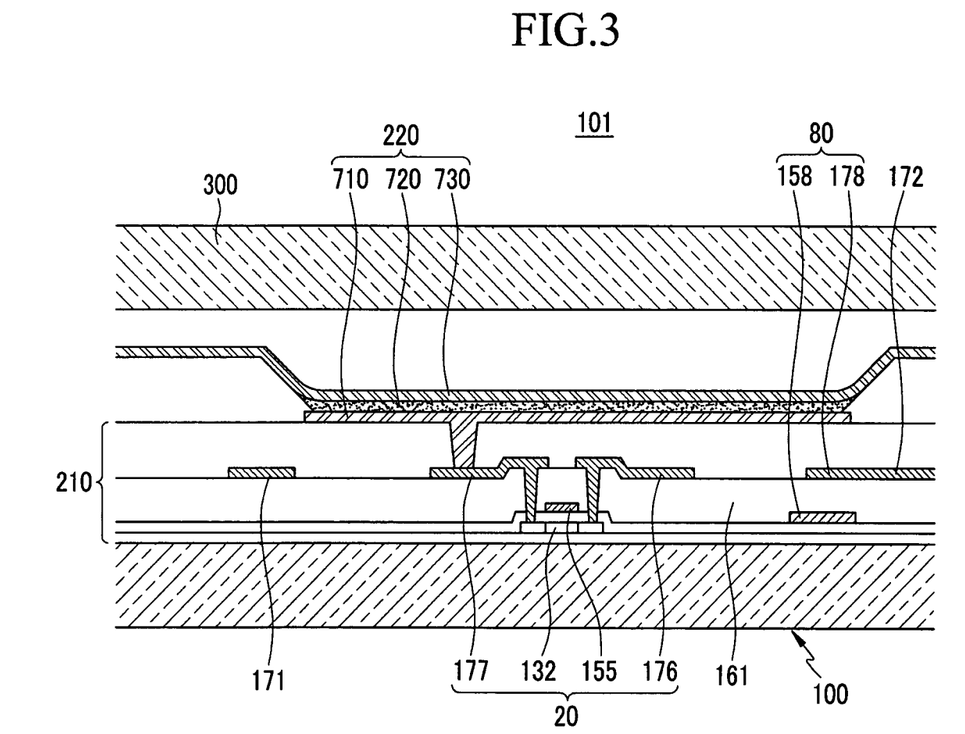
FIG. 3 illustrates a cross-sectional view taken along line III-III of FIG. 2.

Concrete structures of the wiring portion 210 and the organic light emitting diode 200 are illustrated in FIGS. 2 and 3, but the embodiments are not limited thereto. The wiring portion 210 and the organic light emitting diode 220 may have various structures within the scope in which a person skilled in the art may easily change. For example, although the accompanied drawings illustrate an active matrix (AM)-type organic light emitting diode display having a 2Tr-1Cap structure in which one pixel includes two thin film transistors (TFTs) and one capacitor, the embodiments are not limited thereto. Therefore, the number of thin film transistors, the number of capacitors, and the number of lines of the organic light emitting diode display are not limited. A pixel refers to the smallest unit displaying an image, and the organic light emitting diode display displays an image through a plurality of pixels.

As illustrated in FIG. 2 and FIG. 3, each pixel of the display device 101 may include a switching thin film transistor 10, a driving thin film transistor 20, a capacitor 80, and an organic light emitting diode (OLED) 220. Here, a component including the switching thin film transistor 10, the driving thin film transistor 20, and the capacitor 80 may be referred to as the wiring portion 210. The wiring portion 210 may further include a gate line 151 arranged along one direction of the first substrate 100, a data line 171 insulated from and crossing the gate line 151, and a common power line 172. One pixel may be defined by the gate line 151, the data line 171, and the common line 172, but the embodiments are not limited thereto.

The organic light emitting diode 220 may include a first electrode 710, an organic emission layer 720 on the first electrode 710, and a second electrode 730 on the organic emission layer 720. Here, the first electrode 710 may be an anode serving as a hole injection electrode and the second electrode 730 may be a cathode serving as an electron injection electrode. However, the embodiments are not limited thereto, and the pixel electrode 710 may be a cathode and the common electrode 730 may be an anode according to a driving method of the display device 101. That is, holes and electrons may be injected into the organic emission layer 720 from the first electrode 710 and the second electrode 730, respectively, and when excitons formed by recombinations of the injected holes and electrons drop from an excited state to a ground state, the organic emission layer 720 may emit light.

Moreover, in the display device 101 according to the present embodiment, the organic light emitting diode 220 may emit light in the direction of, i.e., toward, the second substrate 300. That is, the organic light emitting diode 220 may be a top emission type. Here, in order for the organic light emitting diode 220 to emit light in the direction of the second substrate 300, the first electrode 710 may be made of a light reflecting conductive material and the second electrode 730 may be made of a light transmissive conductive material. However, the embodiments are not limited thereto, and the organic light emitting diode 220 may emit light in the direction of the first substrate 100 or in the directions of the first substrate 100 and second substrate 300 according to the driving method of the display device 101.

The capacitor 80 may include a pair of capacitor plates 158 and 178 with an interlayer insulating layer 161 interposed therebetween. Here, the interlayer insulating layer 161 may be a dielectric material and the storage capacity of the capacitor 80 may be determined by electric charges stored in the capacitor 80 and voltage between both of the capacitor plates 158 and 178.

The switching thin film transistor 10 may include a switching semiconductor layer 131, a switching gate electrode 152, a switching source electrode 173, and a switching drain electrode 174. The driving thin film transistor 20 may include a driving semiconductor layer 132, a driving gate electrode 155, a driving source electrode 176, and a drain electrode 177.

The switching thin film transistor 10 may be used as a switching element to select a pixel to emit light. The switching gate electrode 152 may be connected to the gate line 151. The switching source electrode 173 may be connected to the data line 171. The switching drain electrode 174 may be spaced apart from the switching source electrode 173 and connected to one 158 of the capacitor plates.

The driving thin film transistor 20 may apply a driving power to the first electrode 710 to emit light from the organic emission layer 720 of the organic light emitting diode 220 in the selected pixel. The driving gate electrode 155 may be connected to the capacitor plate 158 connected to the switching drain electrode 174. The driving source electrode 176 and the other capacitor plate 178 may be connected to the common power line 172. The driving drain electrode 177 may be connected to the first electrode 710 of the organic light emitting diode 220 via a contact hole.

With the above-described configuration, the switching thin film transistor 10 may be driven by a gate voltage applied to the gate line 151 and may supply a data voltage applied to the data line 171 to the driving thin film transistor 20. A voltage corresponding to a difference between the common voltage, which is supplied from the common power line 172 to the driving thin film transistor 20, and the data voltage, which is supplied from the switching thin film transistor 10, may be stored in the capacitor 80. A current corresponding to the voltage stored in the capacitor 80 may flow into the organic light emitting diode 220 through the driving thin film transistor 20 to make the organic light emitting diode 220 emit light.

Referring again to FIG. 1, the second substrate 300 may be made of, e.g., amorphous glass containing silica, and may face the first substrate 100 with the display unit 200 interposed therebetween. The second substrate 300 may surround the display unit 200 and may include a first protrusion 310 protruding in the direction of the first substrate 100.

The first protrusion 310 of the second substrate 300 may include a second portion 311 contacting the first portion 111 of the first substrate 100. The second portion 311 of the second substrate 300 may be optically polished and thus may have an optical surface due to the optical polishing. The second portion 311 of the first protrusion 310 of the second substrate 300 may have surface flatness of about $0.1\lambda$ to about $0.25\lambda$ ($\lambda$ is substantially 632.8 nm), a maximum peak-to-valley roughness of about 100 to about 500 Å or a root-mean-square roughness of about 1 to about 10 Å, and a scratch and dig of about 60-40, substantially similar to the first portion 111. The second portion 311 of the second substrate 300 may be in direct contact with the first portion 111 of the first substrate 100.

As stated above, the first portion 111 of the first substrate 100 and the second portion 311 of the second substrate 300 may be in contact with each other. Accordingly, the first portion 111 of the first substrate 100 and the second portion 311 of the second substrate 300 may be firmly bonded, i.e., coupled, to each other. The coupling of the first portion 111 and the second portion 311 will be described in detail below.

Figure 4:
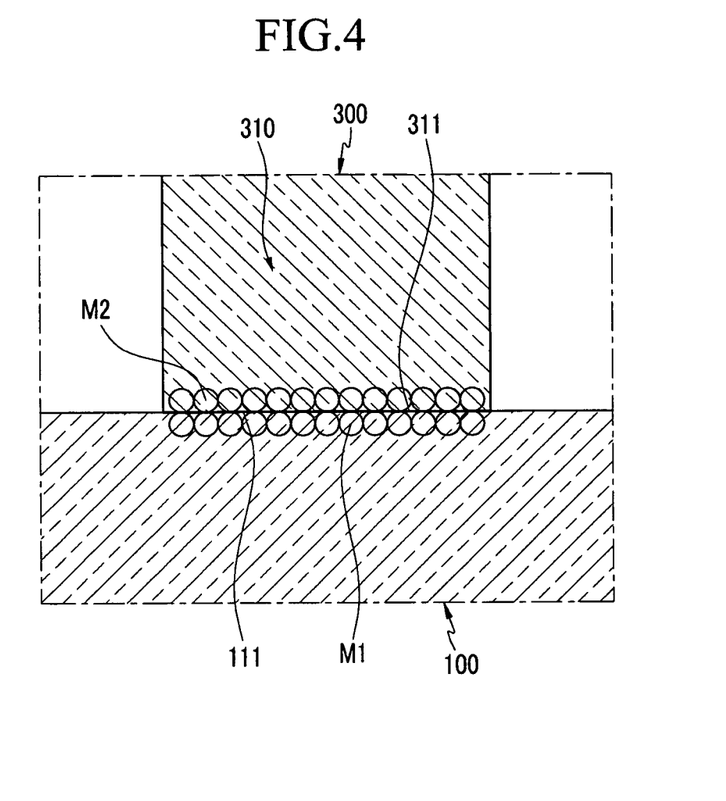
FIG. 4 illustrates an enlarged view of part A of FIG. 1.

FIG. 4 illustrates an enlarged view of part A in FIG. 1.

As illustrated in FIG. 4, the first portion 111 of the first substrate 100 and the second portion 311 of the second substrate 300 may be firmly coupled to each other. Firm coupling between the first portion 111 and the second portion 311 may be achieved due to, e.g., a Van der Waal's force, acting between a first molecule M1 of the first portion 111 and a second molecule M2 of the second portion 311. Such a Van der Waal's attraction may be achieved due to the optical surfaces of the first portion 111 and second portion 311. More specifically, silica, being an optical contact bonding material, may form an induced dipole in the first molecule M1 of the first substrate 100 and the second molecule M2 of the second substrate 300, respectively. A strong Van der Waal's force may act between the first molecule M1 and the second molecule M2, each having an induced dipole, to thus optical contact bond the first substrate 100 and the second substrate 300. Since each of the surfaces of the first portion 111 and the second portion 311 may be an optical surface, the first portion 111 and the second portion 311 may be brought into extremely close contact with each other. Accordingly, a large number of first and second molecules M1 and M2 at an interface between the first portion 111 and the second portion 311 may be attracted to each other, thus optical contact bonding the first portion 111 to the second portion 311. As a result, the first substrate 100 and the second substrate 300 may be firmly coupled to each other.

If the first portion 111 of the first substrate 100 and the second portion 311 of the second substrate 300 do not have sufficient flatness, roughness, and scratch and dig, i.e., if the first portion 111 and/or the second portion 311 do not have optical surfaces, the first portion 111 and the second portion 311 may not be in close enough contact with each other. Thus, a relatively smaller number of first and second molecules M1 and M2, compared to when the first portion 111 and the second portion 311 have optical surfaces, may be attracted to each other at the interface between the first portion 111 and the second portion 311. As a result, optical contact bonding may not occur and the first substrate 100 and the second substrate 300 may not be coupled to each other. If the first portion 111 of the first substrate 100 and the second portion 311 of the second substrate 300 are not coupled to each other, the first substrate 100 may be undesirably separated from the second substrate 300 and the display unit 200 may be exposed to the outside environment. If the display unit 200 is exposed to the outside environment, the display unit 200 may be damaged by, e.g., oxygen and moisture, in the outside environment.

Accordingly, in the display device 101 according to the present embodiment, no interposer need be disposed between the first substrate 100 and the second substrate 300 and the first substrate 100 and the second substrate 300 may be coupled to each other. As a result, due to the lack of the deformable interposer, the first substrate 100 and/or the second substrate 300 may not be deformed. That is, the display device 101 according to the present embodiment may fundamentally prevent, e.g., a Newton's ring phenomenon or residual stress, from appearing at a deformed region because the first substrate 100 or the second substrate 300 may not be deformed.

Hereinafter, a method for manufacturing the display device 101 according to an embodiment will be described with reference to FIGS. 5 to 8.

Figure 5:
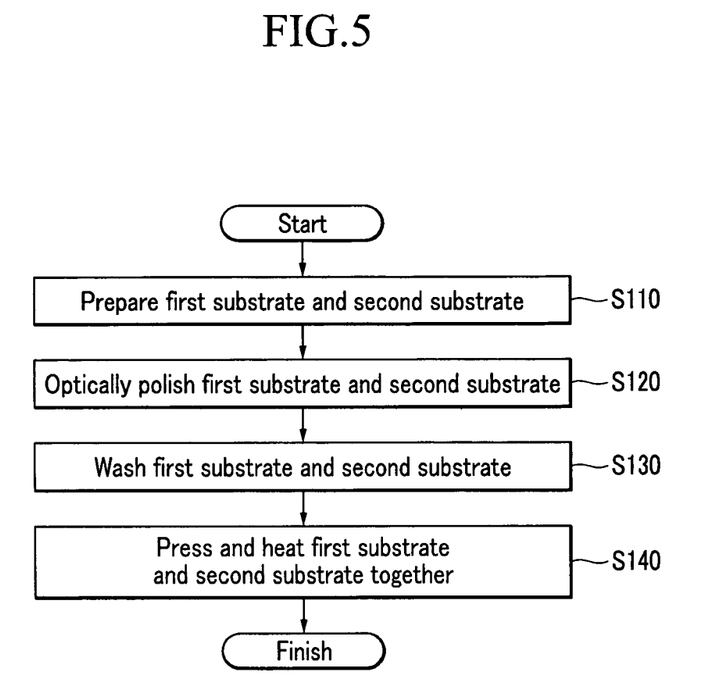
FIG. 5 illustrates a flowchart of a method for manufacturing the display device according to an embodiment.
Figure 6:
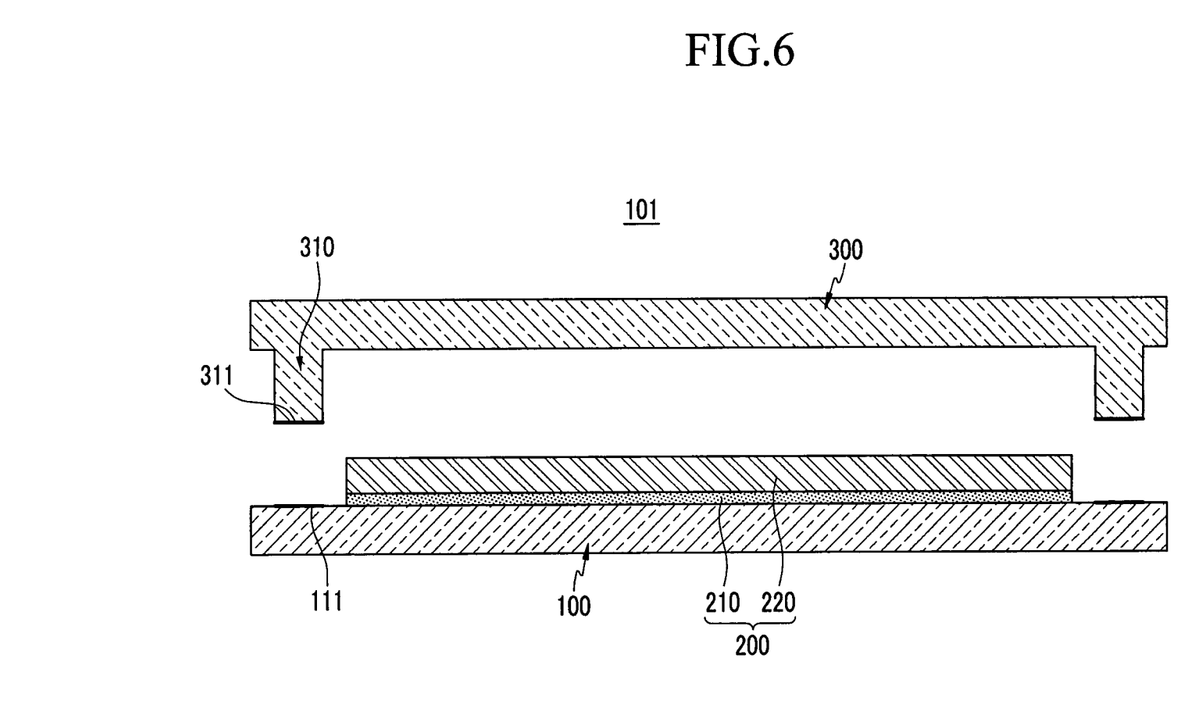
FIGS. 6 and 7 illustrate cross-sectional views of stages in the method for manufacturing the display device.
Figure 7:
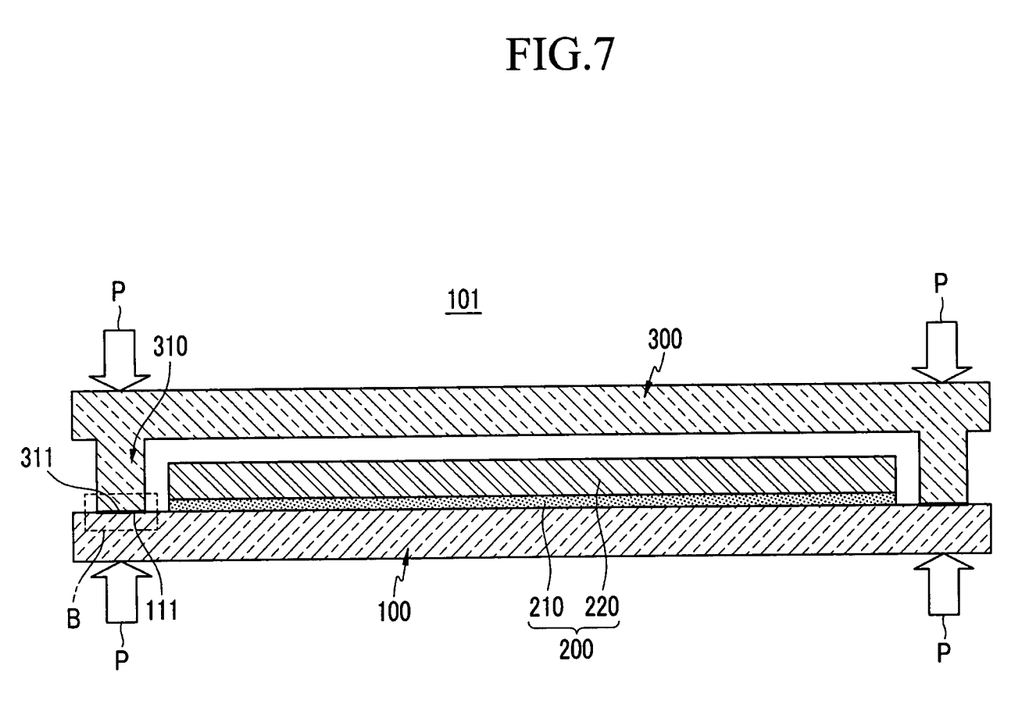
Figure 8:
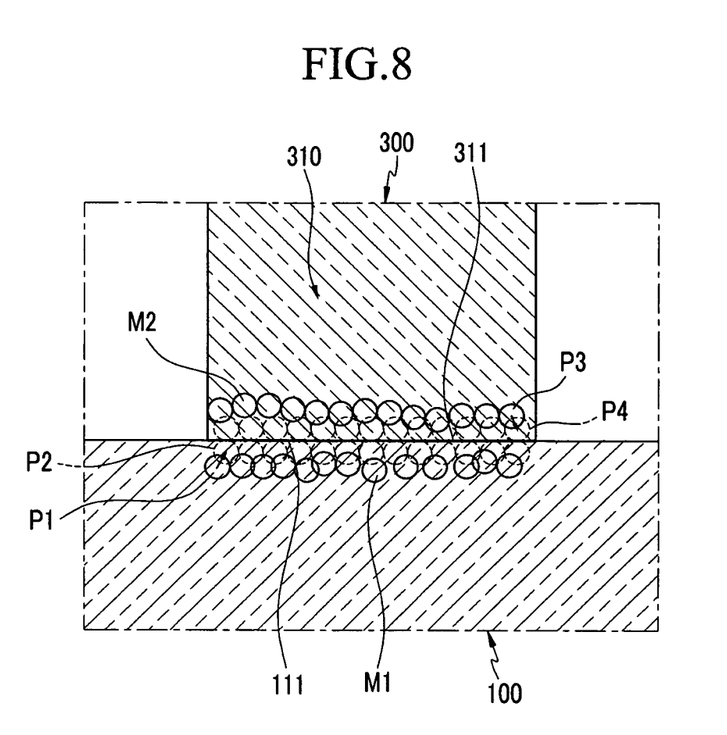
FIG. 8 illustrates an enlarged view of part B of FIG. 7.

FIG. 5 illustrates a flowchart of a method for manufacturing the display device according to an embodiment. FIGS. 6 and 7 illustrate cross-sectional views of stages in the method for manufacturing the display device of FIG. 5. FIG. 8 illustrates an enlarged view of part B in FIG. 7.

First, as illustrated in FIGS. 5 and 6, a first substrate 100 and a second substrate 300 may be prepared (S110).

Specifically, first, a first substrate 100 having a plate shape with a flat surface and a second substrate 300 including a first protrusion 310, each of the substrates being made of, e.g., amorphous glass, may be prepared.

Next, a display unit 200 including a wiring portion 210 and an organic light emitting diode 220 and displaying an image may be formed in a display area on the first substrate 100 using microelectromechanical systems (MEMS) technology, e.g., photolithography.

Next, the first substrate 100 and the second substrate 300 may be optically polished (S120).

Specifically, the first portion 111 of the first substrate 100 and the second portion 311 of the first protrusion 310 may be optically polished to thus form optical surfaces on each of the surfaces of the first portion 111 and second portion 311. Optical polishing of the first portion 111 and the second portion 311 may be performed by, e.g., a mechanical and/or chemical polishing process, such that each of the surfaces of the first portion 111 and second portion 311 has a surface flatness of about $0.1\lambda$ to about $0.25\lambda$ ($\lambda$ is substantially 632.8 nm), a maximum peak-to-valley roughness of about 100 to about 500 Å or a root-mean-square roughness (RMS value) of about 1 to about 10 Å, and a scratch and dig of about 60-40.

Next, the first substrate 100 and the second substrate 300 may be washed (S130).

Specifically, first, inorganic materials remaining on the first portion 111 of the first substrate 100 and the second portion 311 from the optical polishing may be removed. Next, organic materials remaining on the first portion 111 of the first substrate 100 and the second portion 311 may be removed with, e.g., hydrochloric acid (HCl). Next, the first portion 111 and the second portion 311 may each first be washed with acetone prior to washing with alcohol. By washing using this procedure, no undesirable material may remain on each of the surfaces of the first portion 111 of the first substrate 100 and the second portion 311 of the second substrate 300.

Next, as illustrated in FIG. 7 and FIG. 8, the first substrate 100 and the second substrate 300 may be pressed and heated together (S140).

Specifically, as illustrated in FIG. 7, the first portion 111 of the first substrate 100 and the second portion 311 of the second substrate 300 may be brought into contact with each other. Then, a pressure P of about 0.2 to about 1.2 kg/cm² may be applied to regions of the first and second substrates 100 and 300 corresponding to the interface between the first portion 111 and the second portion 311. Then, the environment around the interface formed between the first portion 111 and the second portion 311 may be heated to a temperature of about 30 to about 520° C.

As illustrated in FIG. 8, when the first portion 111 and the second portion 311 are heated and pressed together, a Van der Waal's force may occur between the induced dipole of the first molecule M1 of the first portion 111 and the induced dipole of the second molecule M2 of the second portion 311. Thus, the first molecule M1 of the first substrate 100 may move from a first position P1 to a second position P2 and the second molecule M2 of the second substrate 300 may move from a third position P3 to a fourth position P4, thereby achieving attraction between the first molecule M1 and the second molecule M2 at the interface between the first portion 111 and the second portion 311. Because the surfaces of the first portion 111 and second portion 311 may be optical surfaces, a large number of first and second molecules M1 and M2 may be attracted to each other, thus achieving optical contact bonding and firm coupling between the first substrate 100 and the second substrate 300.

In an alternative implementation, even if the environment around the interface between the first portion 111 and the second portion 311 is not heated and only a pressure P is applied to the region corresponding to the interface, the first portion 111 of the first substrate 100 and the second portion 311 of the second substrate 300 may still be brought into close contact with each other by the pressure P. At the same time, mobility of the first molecule M1 of the first portion 111 and of the second molecule M2 of the second portion 311 may be improved, thereby easily achieving attraction between the first molecule M1 and the second molecule M2.

As described above, in the display device 101 according to the present embodiment, no interposer need be positioned between the first substrate 100 and the second substrate 300 when the first substrate 100 and the second substrate 300 are coupled to each other. As a result, due to the lack of the deformable interposer, the first substrate 100 and/or the second substrate 300 may not be deformed.

In an implementation, in the process for coupling the first substrate 100 and the second substrate 300, no heat may be applied to the first substrate 100 and the second substrate 300, thereby preventing the first substrate 100, the display unit 200, or the second substrate 300 from being damaged or deformed by the heat.

Thus, in the method for manufacturing the display device 101 according to the present embodiment, the first substrate 100 and the second substrate 300 may be coupled together at, e.g., room temperature, only by the use of the first substrate 100 and the second substrate 300 without using any adhesive material in the coupling process. Thus, it is possible to prevent the first substrate 100 and/or the second substrate 300 from being deformed due to deformation of an adhesive material caused by, e.g., hardening of the adhesive material, and to prevent the first substrate 100, the display unit 200, and/or the second substrate 300 from being deformed by heat applied in a bonding process. In this way, e.g., a Newton's ring phenomenon or residual stress, appearing at a deformed region, may be fundamentally prevented because the first substrate 100, the display unit 200, and/or the second substrate 300 may not be deformed.

In summary, the display device 101 and the method for manufacturing the display device 100 according to an embodiment may prevent deformation or damage of the first substrate 100, the display unit 200, and/or the second substrate 300 by performing direct coupling of the first substrate 100 and the second substrate 300 at, e.g., room temperature, without using a sealant, i.e., an adhesive material used for bonding the first substrate 100 and the second substrate 300, and excessive heating, which may result in deformation of the first substrate 100, the display unit 200, and/or the second substrate 300.

Hereinafter, a display device 102 according to another embodiment will be described with reference to FIG. 9.

Figure 9:
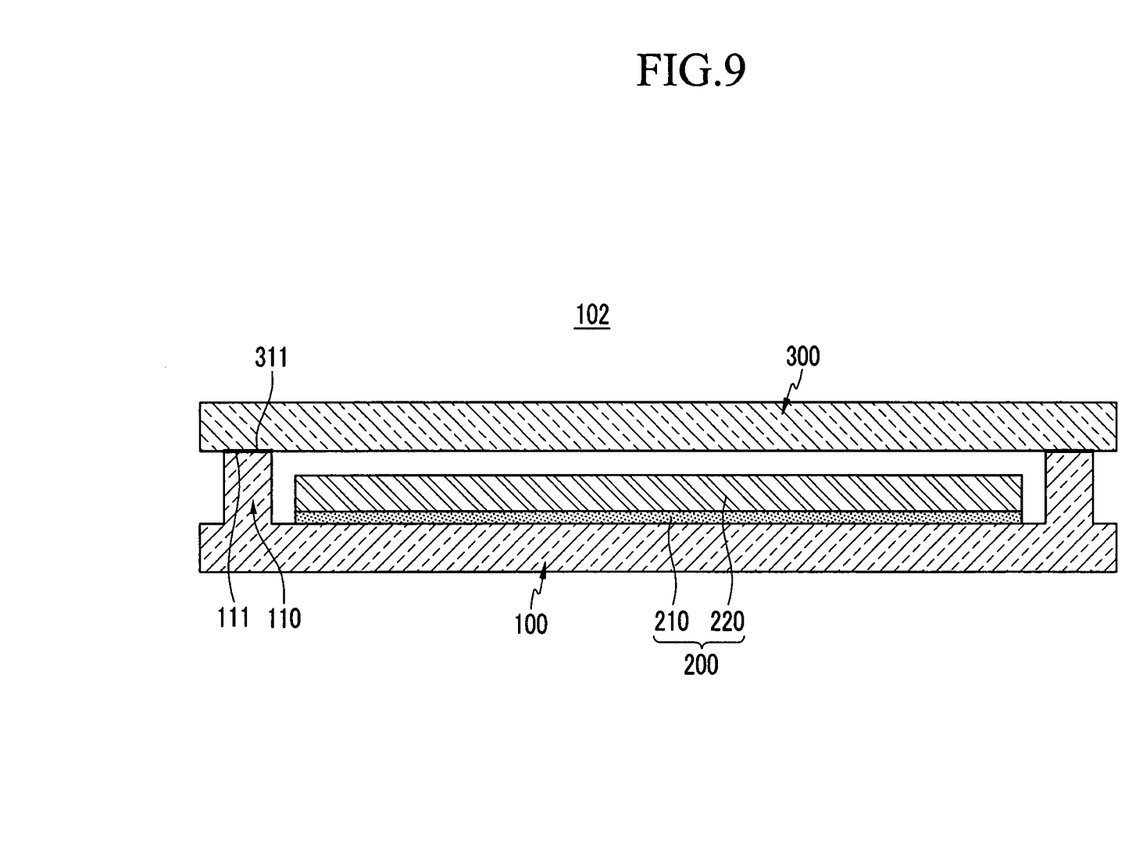
FIG. 9 illustrates a cross-sectional view of a display device according to another embodiment.

FIG. 9 illustrates a cross-sectional view of a display device according to the embodiment.

As illustrated in FIG. 9, the display device 102 according to the present embodiment may include a second substrate 300 having a plate shape with a flat surface and a first substrate 100 including a second protrusion 110 protruding in the direction of the second substrate 300 to contact the second substrate 300.

The second substrate 300 may include a second portion 311 contacting a second protrusion 110 of the first substrate 100. The second protrusion 110 of the first substrate 100 may include a first portion 111 contacting the second substrate 300. Surfaces of the first portion 111 of the first substrate 100 and the second portion 311 of the second substrate 300 may be optically polished and brought into direct contact with each other. Thus, a first molecule M1 of the first portion 111 and a second molecule M2 of the second portion 311 may be attracted to each other, thereby optical contact bonding and firmly coupling the first substrate 100 and the second substrate 300.

As described above, in the display device 102 according to the present embodiment, no interposer need be positioned between the first substrate 100 and the second substrate 300 when the first substrate 100 and the second substrate 300 are coupled to each other. As a result, due to the lack of the deformable interposer, the first substrate 100 and/or the second substrate 300 may not be deformed.

Moreover, the display device 102 according to the present embodiment may advantageously minimize an occurrence of interference on the display unit 200 caused by a polishing process during the optical polishing of the first portion 111 because the first portion 111 of the first substrate 100 may be positioned above the display unit 200.

Hereinafter, a display device 103 according to yet another embodiment will be described with reference to FIG. 3.

Figure 10:
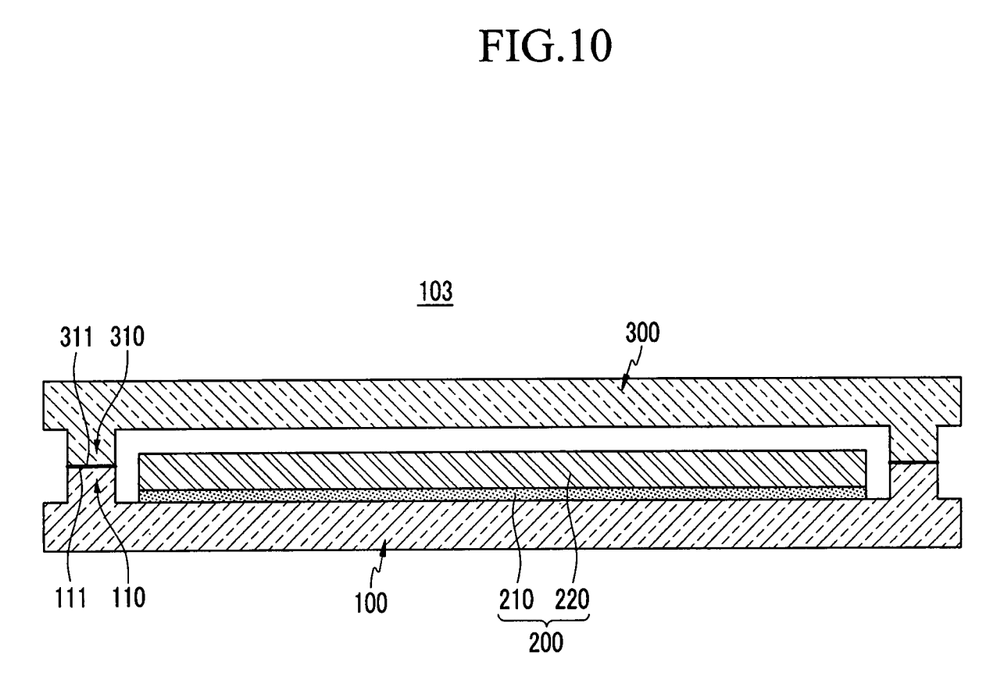
FIG. 10 illustrates a cross-sectional view of a display device according to yet another embodiment.

FIG. 10 illustrates a cross-sectional view of a display device according to the embodiment.

As illustrated in FIG. 10, the display device 103 according to the present embodiment may include a first substrate 100 including a second protrusion 110 protruding in the direction of a second substrate 300 to contact the second substrate 300. The second substrate 300 may include a first protrusion 310 protruding in the direction of the first substrate 100 to contact the first substrate 100.

The second protrusion 110 of the first substrate 100 may include a first portion 111 contacting the first protrusion 310 of the second substrate 300. The first protrusion 310 of the second substrate 300 may include a second portion 311 contacting the second protrusion 110 of the first substrate 100. Facing surfaces of the first portion 111 of the first substrate 100 and the second portion 311 of the second substrate 300 may be optically polished and brought into direct contact with each other. Accordingly, a first molecule M1 of the first portion 111 and a second molecule M2 of the second portion 311 may be attracted to each other and the second protrusion 110 of the first substrate 100 and the first protrusion 310 of the second substrate 300 may be optical contact bonded together, thus firmly coupling the first substrate 100 and the second substrate 300.

As described above, in the display device 103 according to the present embodiment, no interposer need be positioned between the first substrate 100 and the second substrate 300 when the first substrate 100 and the second substrate 300 are bonded to each other. As a result, due to the lack of the deformable interposer, the first substrate 100 and/or the second substrate 300 may not be deformed.

Moreover, in the display device 103 according to the present embodiment, it is possible to optically polish surfaces of the second protrusion 110 protruding from the first substrate 100 and the first protrusion 310 protruding from the second substrate 300 by defining the first portion 111 and the second portion 311 by the second protrusion 110 of the first substrate 100 and the first protrusion 310 of the second substrate 300. Thus, overall manufacturing time may be shortened by optically polishing only the second portion 311 and the first portion 111 respectively defined by the first protrusion 310 and the second protrusion 110.

By way of comparison, in a conventional organic light emitting diode display, when the sealant is hardened, the volume of the sealant may be changed due to, e.g., a high thermal energy required for hardening, or the sealant may not be hardened enough, thus deforming a part of the display substrate or encapsulation substrate contacting the sealant. When a part of the display substrate or encapsulation substrate is deformed by the deformation of the sealant, a Newton's ring phenomenon or residual stress may appear at a deformed region, thereby causing the display substrate or the encapsulation substrate to be easily damaged, even by a slight external impact.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A display device, comprising:
   a first substrate;
   a display unit on the first substrate, the display unit displaying an image; and
   a second substrate facing the first substrate with the display unit interposed therebetween, wherein a first portion of the first substrate and a second portion of the second substrate are in contact with each other and are bonded to each other by an optical contact bond, the first and second portions being made of amorphous glass.

2. The display device as claimed in claim 1, wherein the optical contact bond between the first portion and the second portion is formed by Van der Waal's forces between first molecules of the first portion and second molecules of the second portion.

3. The display device as claimed in claim 1, wherein the first portion-and the second portion are optical surfaces.

4. The display device as claimed in claim 3, wherein the first and second portions have a surface flatness of about $0.1\lambda$ to about $0.25\lambda$ ($\lambda$ is substantially 632.8 nm).

5. The display device as claimed in claim 4, wherein the first and second portions have a maximum peak-to-valley roughness of about 100 to about 500 Å or a root-mean-square roughness (RMS value) of about 1 to about 10 Å.

6. The display device as claimed in claim 5, wherein the first and second portions have a scratch and dig of about 60-40.

7. The display device as claimed in claim 1, wherein the display unit includes an organic light emitting diode for emitting light.

8. The display device as claimed in claim 1, wherein the first substrate includes a second protrusion protruding in the direction of the second substrate, the second protrusion contacting the second substrate.

9. The display device as claimed in claim 1, wherein the second substrate includes a first protrusion protruding in the direction of the first substrate, the first protrusion contacting the first substrate.

10. A display device, comprising:
a first substrate;
a display unit on the first substrate, the display unit displaying an image; and
a second substrate facing the first substrate with the display unit interposed therebetween, wherein:
the first substrate and the second substrate are optical contact bonded to each other,
the second substrate includes a first protrusion protruding in the direction of the first substrate and contacting the first substrate, and
the first substrate includes a second protrusion protruding in the direction of the second substrate contacting the second substrate, the second protrusion contacting the first protrusion.

11. A method for manufacturing a display device, the method comprising:
preparing a first substrate such that the first substrate has a display unit thereon;
preparing a second substrate such that the second substrate faces the first substrate and is in contact therewith the display unit interposed therebetween; and
optical contact bonding a first portion of the first substrate and a second portion of the second substrate together, the first and second portions being made of amorphous glass.

12. The method as claimed in claim 11, wherein the first and second portions have a surface flatness of about $0.1\lambda$ to about $0.25\lambda$ ($\lambda$ is substantially 632.8 nm), a maximum peak-to-valley roughness of about 100 to about 500 Å or a root-mean-square roughness (RMS value) of about 1 to about 10 Å, and a scratch and dig of about 60-40.

13. The method of claim 12, wherein preparing the first substrate and the second substrate includes washing the first and second portions, wherein washing the first and second portions includes:
removing inorganic materials from the first and second portions;
removing organic materials from the first and second portions with hydrochloric acid (HCl);
firstly washing the first and second portions with acetone; and
secondly washing the first and second portions with alcohol.

14. The method as claimed in claim 12, wherein the optical contact bonding of the first substrate and the second substrate includes pressing the first and second substrates together with a pressure of about 0.2 to about 1.2 kg/cm$^2$.

15. The method as claimed in claim 14, wherein the optical contact bonding of the first substrate and the second substrate includes heating the first substrate and the second substrate, and the first and second substrates are heated to a temperature of about 30 to about 520° C.

16. The method as claimed in claim 13, further comprising optically polishing the first portion of the first substrate and the second portion of the second substrate before washing the first portion of the first substrate and the second portion of the second substrate,
wherein the polishing and washing are performed prior to the optical contact bonding.

17. The method as claimed in claim 11, wherein the optical contact bonding forms an optical contact bond between the first portion and the second portion, the optical contact bond being formed by Van der Waal's forces between first molecules of the first portion and second molecules of the second substrate.

18. The method as claimed in claim 11, wherein the first and second substrates are prepared such that each of the first and second substrates includes a protrusion protruding in the direction of and contacting a protrusion of the other of the first and second substrates.

* * * * *